United States Patent [19]

Hirao et al.

[11] 4,185,291

[45] Jan. 22, 1980

[54] JUNCTION-TYPE FIELD EFFECT TRANSISTOR AND METHOD OF MAKING THE SAME

[75] Inventors: Takashi Hirao, Neyagawa; Shigetoshi Takayanagi, Kyoto; Takeshi Onuma, Katano; Toshio Sugawa, Kadoma; Kaoru Inoue, Osaka, all of Japan

[73] Assignee: Matsushita Electric Industrial Co., Ltd., Kadoma, Japan

[21] Appl. No.: 916,818

[22] Filed: Jun. 16, 1978

[30] Foreign Application Priority Data

Jun. 30, 1977 [JP] Japan .................................. 52-78753

[51] Int. Cl.$^2$ ............................................. H01L 29/80
[52] U.S. Cl. ......................................... 357/22; 357/23; 357/52; 357/90; 357/91
[58] Field of Search .................. 357/22, 23, 91, 52, 357/90

[56] References Cited

U.S. PATENT DOCUMENTS

| | | | |
|---|---|---|---|
| 3,656,031 | 4/1972 | Breese et al. | 357/22 |
| 3,936,857 | 2/1976 | Ota | 357/23 |
| 4,053,915 | 10/1977 | Cave | 357/22 |

Primary Examiner—Edward J. Wojciechowicz
Attorney, Agent, or Firm—Cushman, Darby & Cushman

[57] ABSTRACT

A junction-type FET comprising a semiconductor substrate 21 of a first conductivity type, and island region 22 of a second conductivity type which comprises a channel region and is selectively formed in the semiconductor substrate 21, and a buried isolating region 27 which is selected from the group consisting of an intrinsic layer, a low impurity concentration layer of the second conductivity type and a layer of first conductivity type, the buried isolating layer being formed by ion implantation of impurities of the first conductivity type in the island region 22 while keeping the impurity concentration at the surface thereof relatively high, and the buried isolating layer substantially isolating the channel region from the surface.

18 Claims, 13 Drawing Figures

JUNCTION-TYPE FIELD EFFECT TRANSISTOR AND METHOD OF MAKING THE SAME

BACKGROUND OF THE INVENTION

1. Field of technology

The present invention relates to a junction-type field effect transistor (hereinafter referred to J-FET for short).

2. Prior Arts

In general, a p-n junction-type field effect transistor is conventionally fabricated by using epitaxial method and thermal diffusion method. FIG. 1 shows a structure of the J-FET fabricated by the epitaxial method. An n-conductivity type silicon layer 2 is made on a p-type silicon substrate 1 by the epitaxial method. And an n-type island region 2 is formed by diffusing p-type isolating regions 3,3. And in the island region 2, a source region 4 and a drain region 5 of n+-type are formed. Then a p+-type gate region 6 is formed by the thermal diffusion method. Thus, a J-FET is fabricated as shown in FIG. 1. In the J-FET shown in FIG. 1 it is difficult to control thickness of the epitaxial layer 2 formed on the p-type silicon substrate 1 and depth of the gate region 6; in other words it is difficult to control channel thickness "t" in FIG. 1. Therefore, drain current flowing between the source and the drain can not be sufficiently controlled as designed.

To improve this situation it is also proposed that the n-type island region 2 is formed on the p-type substrate by ion implantation. It is known that, the scatter of the drain current in a wafer is reduced from ±80% of the ones fabricated by the epitaxial growth method to ±20% of the ones by the ion implantation method. But if the island region 2 is formed by the ion implantation, a heat treatment follows thereafter. Therefore, after the heat treatment, the distribution of the donor impurity concentration in the n-type island region 2 has its maximum at the surface part. Accordingly, most of the drain current flows through surface states, which act as recombination centers, and hence output signal has noise due to recombination and surface effect.

As another prior art to reduce surface current, a device comprising i-type (intrinsic) region at the surface thereof is disclosed in the specification of the U.S. Pat. No. 3,656,031 for H.J. Bresee et al. FIG. 2 shows the device, wherein a low concentration region 11 of p-type conductivity is diffused on an n-type silicon substrate. Impurity concentration of the region 11 has its maximum at the surface. Between a source region 13 and a drain region 12, a highly doped diffused gate region 14 of an n+-type conductivity is formed. The J-FET thus formed is characterized by comprising a surface region 15 of low impurity concentration p−-type or of high resistivity intrinsic region (i-layer) which is formed by lowering the surface impurity concentration of the p-type island region 11.

This surface region 15 can be formed, for example, (i) by using segregation effect of the p-type impurity during thermal oxidation of the substrate material, to obtain the p−-type layer, (ii) by diffusing a small amount of n-type impurities, which is opposite to the conductivity type of a channel to obtain the i-type layer, (iii) by using ion implantation of the p-type impurities to have a concentration peak at a specified depth from the surface and to use the ion-implanted p-type layer as the channel, or (iv) by using epitaxial process to form the i-type layer at the surface.

The device shown in FIG. 2 is fabricated in such a manner that the channel region of high impurity concentration is formed in the bulk material under the intrinsic or low conductivity region to reduce noise due to surface effect.

In this case, channel current flows inside the bulk material, since the surface region on the channel is p−-type layer or intrinsic layer. But the channel current is likely affected by the condition of the surface through the surface region 15, and noise source still exists. This situation arises from the fact that owing to smallness of carrier density in the i-type layer or p−-type layer, the conductivity variation owing to carriers generated at the surface and other carriers generated owing to the effect of ions in an insulation layer on the surface is extremely large. Accordingly, electric field variation by the conductivity variation acts on the channel thereunder, and the noise comes into the channel current.

As clearly shown in the fact that a MOS-type semiconductor device utilizes the surface conductivity modulation, the conductivity variation in the i-type or p−-type layer is large. This variation affects the channel region thereunder and therefore it is impossible to completely eliminate the adverse effect at the surface. That means, it is not preferable to form the layer of low impurity concentration or of intrinsic type at the surface part above the channel.

SUMMARY OF THE INVENTION

The present invention purports to provide a J-FET which is little affected by the effect at the surface condition and is superior in the noise characteristics; in other words, lowfrequency noise in an outut signal is reduced.

BRIEF EXPLANATION OF THE DRAWING

FIG. 4' is a schematic sectional elevation view of a J-FET made by a modified forming method.

DETAILED DESCRIPTION OF THE INVENTION

Figure 4:
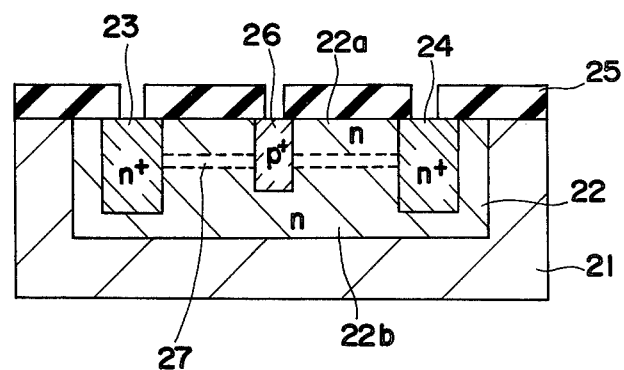
FIG. 4 (A) to FIG. 4 (F) are schematic sectional elevation views showing steps of making method of the J-FET of FIG. 3 in accordance with the present invention.
Figure 4:
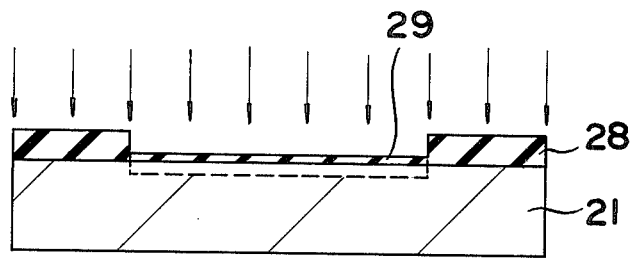
Figure 4:
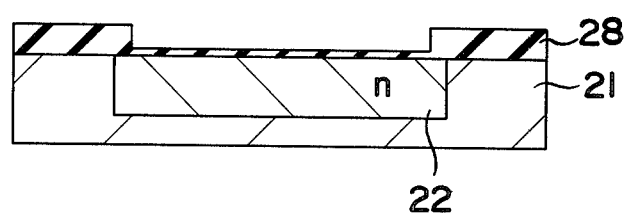
Figure 4:
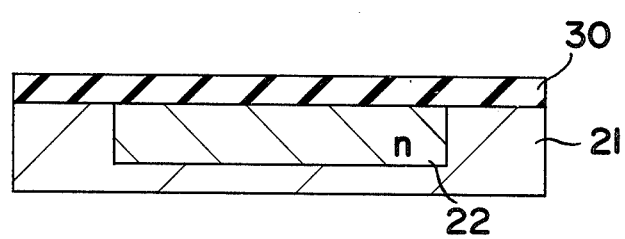
Figure 4:
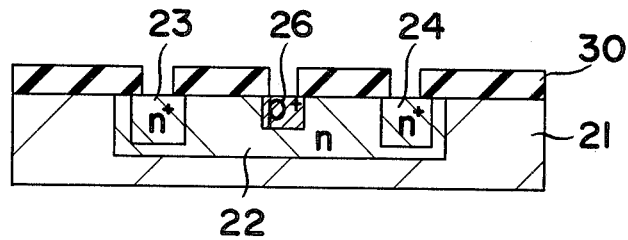
Figure 4:
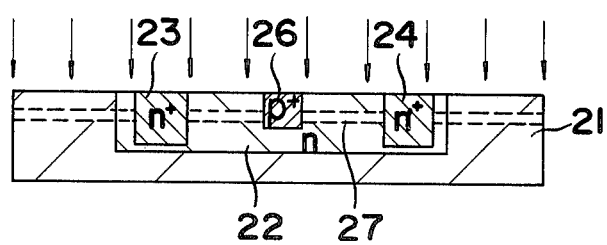
Figure 4:
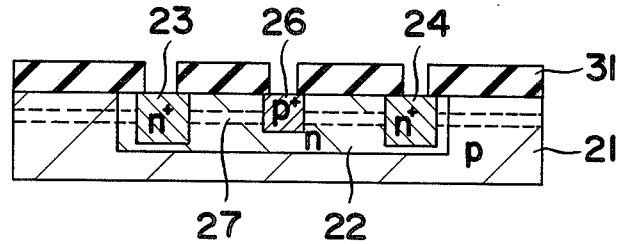
Figure 5:
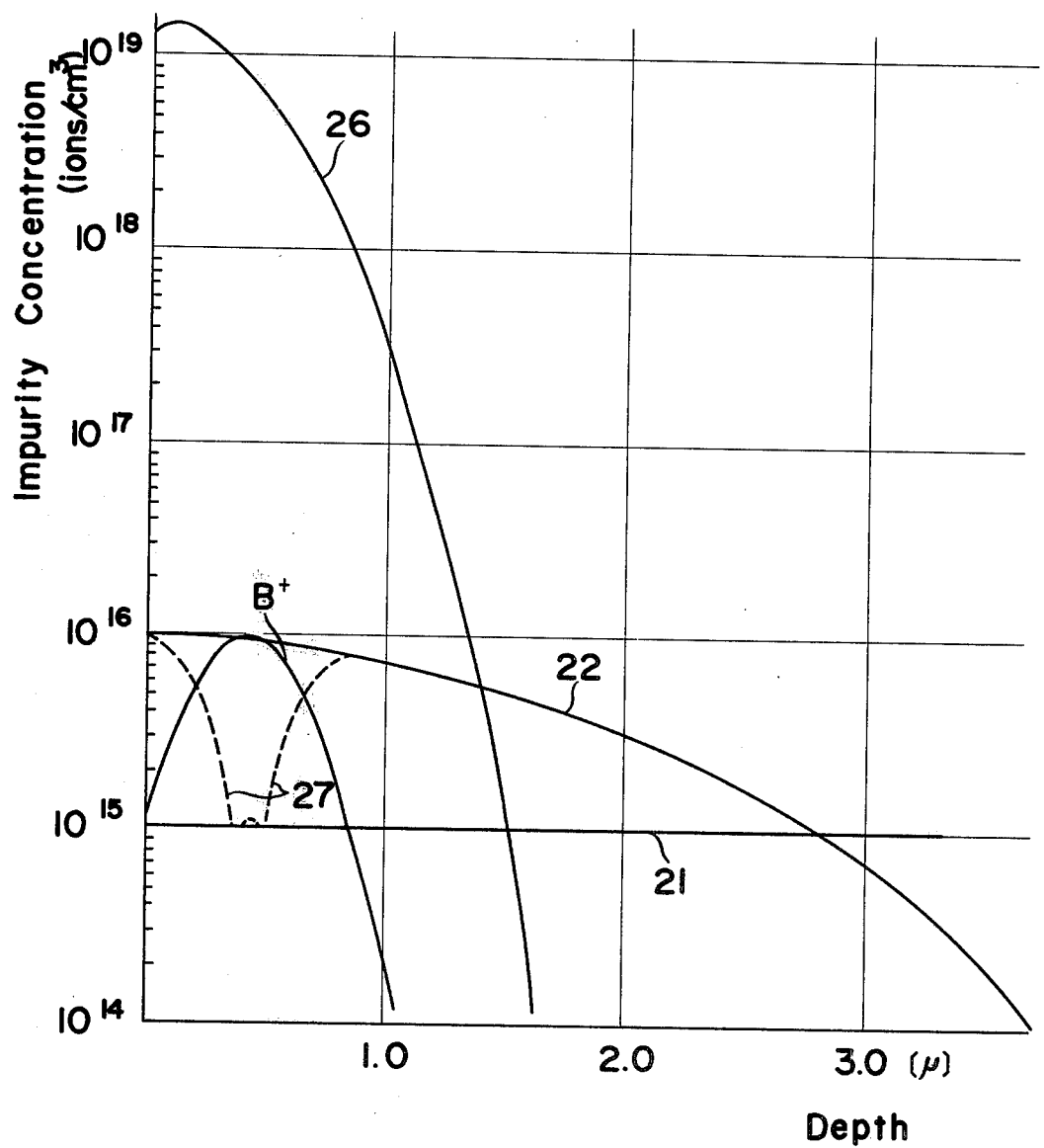
FIG. 5 is a diagram showing impurity concentration distribution of J-FET's shown in FIG. 3 and FIG. 4.
Figure 6:
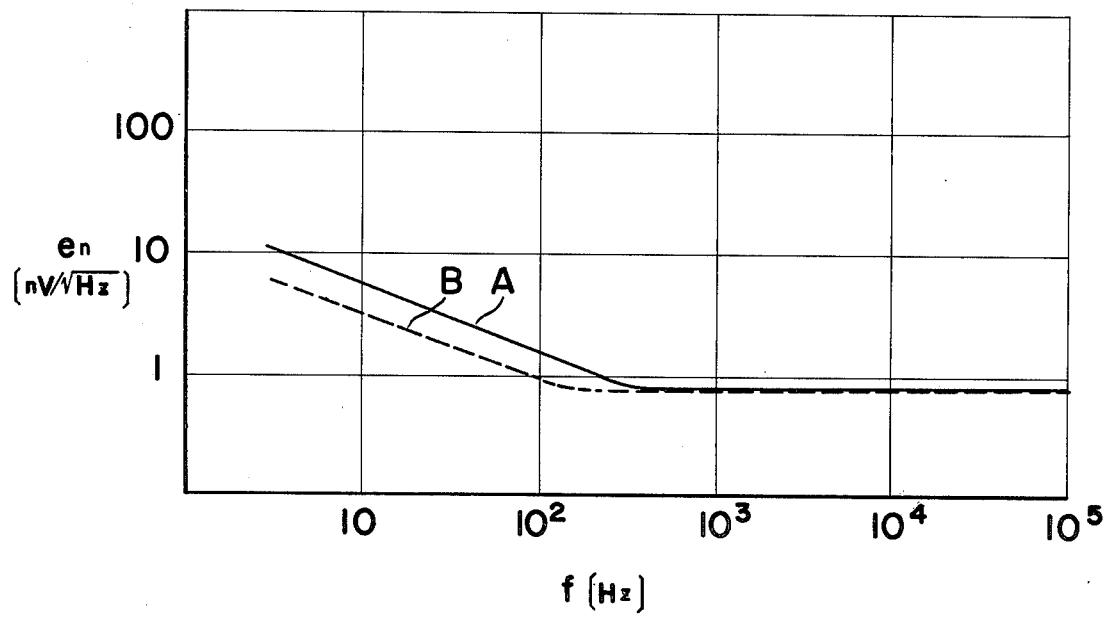
FIG. 6 is a diagram showing noise characteristics of the conventional J-FET and of the one in accordance with the present invention.
Figure 7:
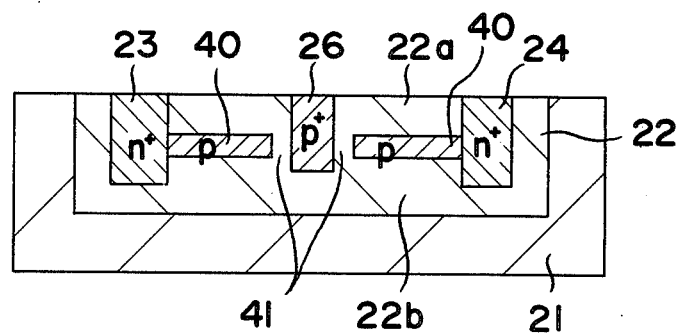
FIG. 7 is a schematic sectional elevation view of an another example of J-FET embodying the present invention.

Hereinafter, the present invention is described in detail referring to the drawings of FIG. 3, FIG. 4 (A) to FIG. 4 (F), FIG. 4', FIG. 5, FIG. 6 and FIG. 7, showing preferred embodiments of the present invention.

Figure 3:
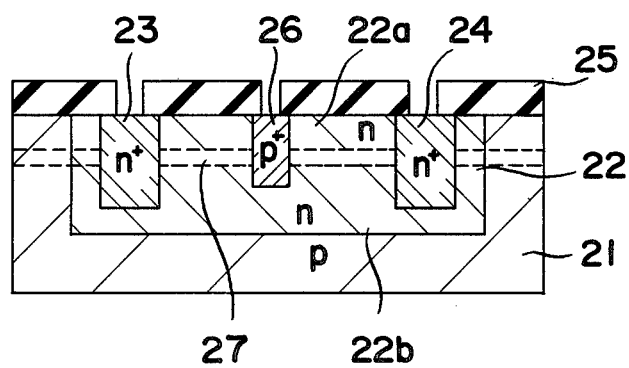
FIG. 3 is a schematic sectional elevation view of an example of a J-FET embodying the present invention.

A J-FET of a first example of the present invention before forming electrodes is shown by FIG. 3. For a p-channel J-FET device, a substrate 21 is of p-type, (100) and 8–10Ω·cm silicon, and has an impurity concentration shown by a curve 21 in FIG. 5. Other curves similarly show impurity concentrations of the regions designated by the corresponding reference numerals in FIG. 3. An n-type island region 22 is formed in the p-type substrate 21 by an ion implantation of, for example, phosphorus as donor, and the impurity concentration distribution thereof is approximately in gaussian distribution profile and has its maximum at the surface as shown by FIG. 5. A source 23 and a drain 24 of n+-type high impurity concentration, and a gate 26 of p+-type are formed by thermal diffusion method or ion implantation. A region of high resistivity 27 is formed inside the substrate at the same depth with, or a shallower depth than, that of the diffusion front of the gate region 26 along the channel between the source and drain regions, by means of an ion implantation of, for example, B+(boron ion) as acceptor impurities. This ion implantation is carried out in such a manner that the distribution of the ion implanted-B+ ions has its peak at a specified depth inside the island region as indicated by the curve "B+" in FIG. 5. The implanted-B+ ions thereby compensating the previously implanted donor impurities of the island region 22. The resulting total negative charge distribution profile has a dip as shown by a broken curve 27 in FIG. 5. Therefore, the layer of high resistivity 27 is formed between the source and drain regions and is buried at a specified depth inside the island region 22. The layer of high resistivity 27 thus formed between the source and drain regions contacts the gate region 26, and accordingly, the island region 22 is divided by the layer of high resistivity 27 into a surface region 22a and a channel region 22b. These two regions in the island region 22 are electrically isolated from each other by the high resistivity region 22. An insulation layer 25 covers the surface of the J-FET except on the part of electrode windows on the drain, source and gate regions.

One embodiment of the making steps of the J-FET shown in FIG. 3 is elucidated referring to (A) to (F) of FIG. 4. An oxide film 28 is thermally grown to a thickness of about 5,000 Å in oxygen bubbled through 95° C. water on all over the surface of a p-type silicon substrate 21 which has an acceptor impurity concentration of $1 \times 10^{15}$ ions/cm$^3$. The oxide film 28 is selectively removed to form a window 29 of about 300 Å thick SiO$_2$ film for ion implantation therethrough, as shown in FIG. 4 (A). P+ ions (phosphorus cations) of amount of $1.7 \times 10^{12}$ ions cm$^{-2}$ is implanted at 60 keV into the bulk material, and it is driven-in by a heat treatment at 1,100° C. for 30 hours in dried N$_2$ to form an island region 22 at about 2.3μ from the surface as shown in FIG. 4 (B).

The n-type island region 22 has a shape as shown in FIG. 4 (B). An oxide film 30 of 5,000 Å is thermally grown anew by wet O$_2$ method or CVD method on the n-type island region 22 as shown in FIG. 4 (C). The oxide film 30 is then selectively removed, P+(phosphorus) ions of $1 \times 10^{15}$ cm$^{-2}$ are implanted at 50 keV on the substrate and a heat treatment is carried out at 1,000° C. for 15 minutes in N$_2$ thereby to form the source region 23 and the drain region 24 of n+-type in the island region 22.

Then, another oxide film of about 5,000 Å thickness is thermally grown on the island region 22 and the part of the oxide film between source and drain is selectively removed, and the gate region 26 of p+-type is formed by thermal diffusion method or ion implantation method as shown in FIG. 4 (D). For example, the gate region 26 is formed by ion implantation of B+ ions (boron cations) of $10^{15}$ cm$^{-2}$ at 30 keV, and the gate region having a junction depth at about 1.3μ can be formed after a heat treatment at 1,100° C. for 20 minutes. After this process, the SiO$_2$ film 30 used as a mask is completely removed, B+ ions (boron cations) of $5 \times 10^{11}$ cm$^{-2}$ are implanted at 150 keV and heat treatment is carried out at 800° C. for 30 minutes in N$_2$ thereby to form an intrinsic layer 27. Peak value of the implanted-B+ concentration is selected to be about $8 \times 10^{15}$ ions/cm$^3$. Therefore, the previously implanted-P+ donor impurities of the island region 22 at the depth of about 0.4μ from the surface are compensated thereby changing the specified depth portion in the island region 22 into the intrinsic high resistivity region 27 as shown in FIG. 4 (E).

The B+-implanted region of the n-type island region 22 has the total impurity distribution as shown by the broken curve 27 in FIG. 5, and the high resistivity region 27 of almost intrinsic nature is formed around the depth where the peak appears on the curve B+ for the B+-implanted concentration. Since the density of the B+-ions is very low at around the surface of the island region, the density of the total effective charge at around the surface of the island region is not compensated, accordingly the surface of the island region retains the peak value of the island region. This is an important feature of the present invention. Thereafter, an oxide film 31 of about 4,000 Å for passivation is grown by a thermal oxidation on the whole surface of the substrate. This oxidation is made by heating at about 1,000° C. for about one hour in wet O$_2$. Successively windows for source, gate and drain contacts are formed as shown by FIG. 4 (F).

When the J-FET has such configuration that gate contact is formed on the whole surface of the gate region 26, a severe registration of the contact with the gate region is necessary. For such type of J-FET, in order to decrease number of difficult registration in making the insulation films with windows, it is advantageous to form the high resistivity region 27 prior to forming of the gate region 26, thereby utilizing the SiO$_2$ mask 30, used as gate diffusing mask, also as the passivation mask.

The distribution of the carrier density of the high resistivity region 27 is shown by the dotted curve 27 in FIG. 5, wherein the curve 27 shows the distribution in the finished device, wherein the intrinsic region 27 redistributes after original distribution of the implanted-B+ ions and impurities as a result of annealing after the implantation.

A modified J-FET shown in FIG. 4' can be made in a similar manner as described above. But the pattern of high resistivity region 27 can be modified, for example, to such pattern wherein the high resistivity region is limited only between the source-gate area and the drain-gate area but not outside the source region and the drain region.

Such limiting of B+-implantation only in the area between the source-gate and drain-gate can be made by use of a suitable masking means such as a photo resist film.

The surface region 22a of the island region has the maximum effective carrier density of n-type at the surface in the island region 22, and is cut by the gate region 26 as shown in FIG. 3. Therefore, the finished J-FET now comprises a n-i-n structure in the island region, and hence, the surface does not affect the channel region 22b owing to the isolating layer thereby enabling to decrease noise. This is understood from the fact that carriers generated in the surface region 22a are readily recombined in the surface region 22a of high carrier density, and therefore, the conductivity modulation hardly occurs and the surface effect as a noise source is not transferred to the high resistivity layer 27 and the channel region 22b. Furthermore, the channel current of the channel region 22b does not contain noise factor due to surface effect, since the channel current is isolated by the high resistivity layer 27.

Figure 1:
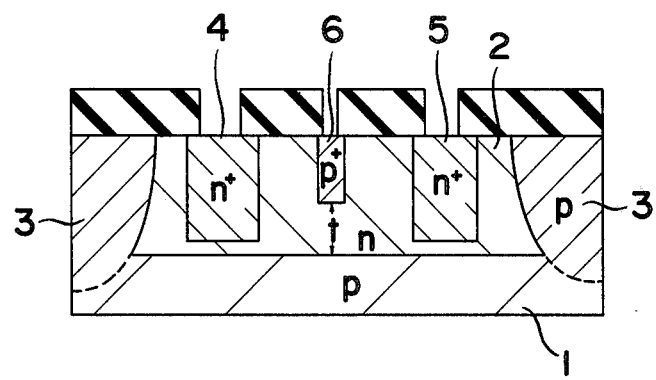
FIG. 1 is a schematic sectional elevation view of a conventional J-FET formed by epitaxial method and diffusion method.
Figure 2:
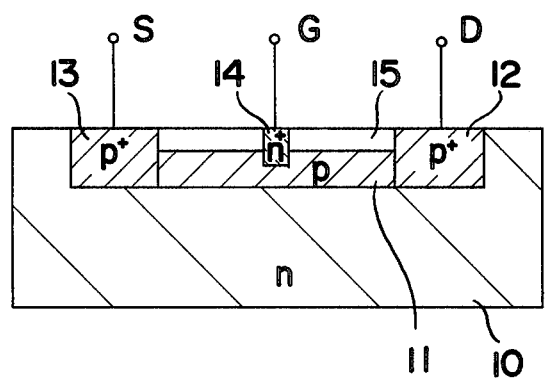
FIG. 2 is a schematic sectional elevation view of a conventional J-FET comprising a surface layer of a low impurity concentration.

On the contrary, in the case of the conventional J-FET, wherein the impurity concentration (donor minus acceptor) of the surface region 22a is near the intrinsic range, time required for recombination (life time) of the carriers generated due to surface effect is long and the conductivity modulation is large thereby giving the modulation to the channel region 22b, resulting in much noise. This situation is the fluctuation of charrier density in the intrinsic layer as the case in FIG. 2.

On the other hand, the present invention purports to provide the J-FET is advantageous in making the FET of junction type wherein, requirements of uniformity of characteristics as designed is very strict. Such uniform designed characteristics is achieved by forming the isolating region of high resistivity in the island region having a considerable conductivity at the surface part. By the ordinary conventional knowledge of FET, it has been feared that some noise might be produced by some defects in the island region resulting from the ion implantation, but we successfully confirmed that isolation by the intrinsic or high resistivity region from surface effect is much more effective than the abovementioned implantation factor. Namely, the present invention achieves superior noise figure for low-frequency noises.

A curve A of FIG. 6 shows the characteristics of the noise equivalent voltage $e_n$ [nV/$\sqrt{Hz}$] against several frequencies (f) for the conventional J-FET excluding high resistivity region 27. The measurement is done on the device, which is made after the process that a surface oxide film used for selective diffusion is removed after the formation by the selective diffusion of the gate region and then another oxide film for passivation is grown by a heat treatment at 1,000° C. for 90 minutes. The measurement is carried out under the condition of:
the voltage between source and drain: $V_{DS}=5V$,
gate voltage: $V_G=0V$,
resistivity of the signal souce: $R_G=100$ K$\Omega$ and $g_m=100$ m℧.

A curve B of FIG. 6 shows the corresponding noise figure for the device fabricated by the method illustrated in FIG. 4 (A) to FIG. 4 (F), and it is obtained under the same experimental condition.

As clearly shown in FIG. 6, the present invention provides the J-FET, whose noise equivalent voltage $e_n$ is extremely diminished at low frequency range. The J-FET of the present invention is superior in the noise figure for low frequencies. This J-FET is effectively applied in various fields.

It is important to note that the high resistivity region 27 in accordance with the present invention cannot be formed buried in the substrate by means of the diffusion method. Instead, if the epitaxial growth method would be used, there would appear the following several problems:

(i) redistribution of the impurities in the substrate is considerble, (ii) there are many defects at the interfaces between the high resistivity region and the layers contacting therewith, (iii) since the impurity concentration at the interface is high, the channel current flows near the interface thereby giving rise to much noise, and as the worst of shortcomings, (iv) the fabrication step is complex and is thought to be not reproducible in mass-production line.

The above-mentioned two methods are therefore not practical for the purpose to form the buried high resistivity region.

On the contrary, the high resistivity region 27 of the present invention is formed by the ion implantation. The impurities of the island region are compensated near the interface of the region 27, and the channel region 22b. And therefore, the distribution of the carrier density gradually and continuously decreases from the top of the channel region 22b toward the high resistivity region 27. Accordingly the channel current does not flow near the interface but flows inside the region 22b. Accordingly, the noise current also decreases in this respect.

The present invention also provides technologically advantageous manufacturing method requiring only simple steps.

Another embodiment in accordance with the present invention is elucidated referring to FIG. 7. A J-FET shown in FIG. 7 is made by the steps that isolating regions 40 of p-type are formed in an island region 22 of n-type by means of an ion implantation. This isolating regions 40 are provided contacting a source region and a drain region but parting from a gate region 26 with parting gaps 41 in between. The parting gaps 41 are necessary in order to decrease gate junction area hence to reduce gate leakage current. Otherwise, junction areas of the gate region becomes large giving rise to undesirable gate leakage current.

This J-FET comprises gaps 41 between the gate region 26 and the regions 40. Since the gaps 41 are almost filled with the depletion layer of the gate region 26, the surface current does not substantially flow in the surface region 22a to contribute channel currents. Even if the surface current flows a little, resistivity therefor is high due to a long current path contributing again almost no channel current. Therefore, though the isolating region 40 is formed in a manner to have parting gaps between the isolating region and the gate region 26, the channel region 22b is operatively divided from the surface region 22a.

Our discussion has stressed its weight on the n-channel J-FET, but it is natural that the present invention can be applied to a p-channel J-FET.

In conclusion, the high resistivity region in accordance with the present invention, which is formed buried inside the island region, prevents the drain current from flowing in the region of the high impurity concentration at the surface. The drain current therefore flows in the channel region under the high resistivity region, and hence noise sources for the output signal is diminished, that is, the device functions free from the surface effect such as the carrier recombination at the surface.

It is industrially advantageous that the present invention can provide the J-FET free from the surface effect, and that the J-FET device can be reproducibly made without troubles during production steps by use of the ion implantaion to form the high resistivity region inside the island region.

What is claimed is:

1. A junction-type FET comprising
   a semiconductor substrate of a first conductivity type,
   an island region of a second conductivity type opposite to said first conductivity type which island region is selectively formed in said semiconductor substrate with its top surface contiguous to the top surface of said substrate,
   a spaced source region and drain region of a high impurity concentration of said second conductivity type selectively formed in said island region,
   a gate region of a high impurity concentration of said first conductivity type selectively formed between said source region and said drain region in said island region with its bottom shallower than the bottom of said island region,
   a buried isolating region which is selected from the group consisting of an intrinsic layer and a low impurity concentration layer of said second conductivity type, which is formed at a specified depth shallower than the bottom of said gate region between said source region and said drain region in said island region, and which is disposed substantially parallel to said surface of said island region to divide said island region into a surface region and a channel region which is under the buried insulating region.

2. A junction-type FET in accordance with claim 1, wherein the impurity concentration in said island region is maximum at the surface of said semiconductor substrate.

3. A junction-type FET in accordance with claim 1, wherein
   said isolating region is an ion-implanted region containing impurities of said second conductivity type.

4. A junction-type FET in accordance with claim 1, wherein
   said isolating region is a high resistivity region of said second conductivity type.

5. A junction-type FET of claim 1, wherein said buried isolating region is divided into two parts, one disposed on one side of the gate region and the other disposed on the other side of the gate region.

6. A junction-type FET in accordance with claim 5, wherein the impurity concentration in said island region is maximum at the surface of said semiconductor substrate.

7. A junction-type FET in accordance with claim 5, wherein said isolating region is an ion-implanted region containing impurities of said second conductivity type.

8. A junction-type FET in accordance with claim 5, wherein said intrinsic layer is formed shallower than the deepest part of said gate region, and divides said island region into a surface region and a channel region which is under said intrinsic layer.

9. A junction-type FET in accordance with claim 5, wherein
   said isolating region is a high resistivity region of said second conductivity type.

10. A junction-type FET comprising
    a semiconductor substrate of a first conductivity type,
    an island region of a second conductivity type opposite to said first conductivity type which island region is selectively formed in said semiconductor substrate with its top surface contiguous to the top surface of said substrate,
    a spaced source region and drain region of a high impurity concentration of said second conductivity type selectively formed in said island region,
    a gate region of a high impurity concentration of said first conductivity type selectively formed between said source region and said drain region in said island region, with its bottom shallower than the bottom of said island region,
    a buried isolating region of a high impurity concentration layer of said first conductivity type formed at a specified depth shallower than the bottom of said gate region between said source region and said drain region in said island region, and which buried isolating region contacts with said source region and said drain region and is spaced from said gate region by a predetermined distance, and is disposed substantially parallel to said surface of said island region to divide said island region into a surface region and a channel region which is under said buried isolating region.

11. A junction-type FET in accordance with claim 10, wherein the impurity concentration in said island region is maximum at the surface of said semiconductor substrate.

12. A junction-type FET in accordance with claim 10, wherein
    said isolating region is an ion-implanted region containing impurities of said second conductivity type.

13. A junction-type FET in accordance with claim 10, wherein
    said intrinsic layer is formed shallower than the deepest part of said gate region, and divides said island region into a surface region and a channel region which is under said intrinsic layer.

14. A junction-type FET in accordance with claim 10, wherein
    said isolating region is a high resistivity region of said second conductivity type.

15. A method of making a junction-type FET comprising the steps of:
    in a substrate of a first conductivity type, forming an island region of a second conductivity type,
    forming a source and a drain region of a high impurity concentration and of said second conductivity type in said island region,
    forming a buried isolating region in said island region by an ion implantation of impurities of said first conductivity type from the front face of said island region in a manner to have maximum impurity concentration at the position of specified uniform depth from said surface of said island region and to offset the impurity of the second conductivity type, and
    forming a gate region of a high impurity concentration and of a first conductivity type between said source region and said drain region in said isolating region, said gate region being shallower than the bottom of said island region and deeper than said buried isolating region.

16. A method of making a junction-type FET comprising the steps of:
    in a substrate of a first conductivity type, forming an island region of a second conductivity type,
    forming a source and a drain region of a high impurity concentration and of said second conductivity type in said island region,
    forming a gate region of a high impurity concentration and of a first conductivity type shallower than the bottom of said island region, between said source region and said drain region, and forming an isolating region shallower than the bottom of said gate region in said island region by an ion implantation of impurities of said first conductivity type from the front face of said island region in a manner to have maximum impurity concentration at the position of specified uniform depth from said surface of said island region and to offset the impurity of the second conductivity type.

17. A method of making a junction-type FET of claim 15, wherein
said buried isolating region is formed divided into two parts, one disposed on one side of the gate region and the other disposed on the other side of the gate region.

18. A method of making a junction-type FET of claim 16, wherein
said buried isolating region is formed divided into two parts, one disposed on one side of the gate region and the other disposed on the other side of the gate region.

* * * * *